US008748252B1

(12) United States Patent
Leobandung et al.

(10) Patent No.: US 8,748,252 B1
(45) Date of Patent: Jun. 10, 2014

(54) REPLACEMENT METAL GATE TRANSISTORS USING BI-LAYER HARDMASK

(71) Applicant: International Business Machines Corporation, Armonk, NY (US)

(72) Inventors: Effendi Leobandung, Wappingers Falls, NY (US); William Cote, Poughquag, NY (US); Laertis Economikos, Wappingers Falls, NY (US); Young-Hee Kim, Mohegan Lake, NY (US); Dae-Gyu Park, Poughquag, NY (US); Theodorus Eduardus Standaert, Clifton Park, NY (US); Kenneth Jay Stein, Sandy Hook, CT (US); YS Suh, Poughquag, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 13/684,869

(22) Filed: Nov. 26, 2012

(51) Int. Cl.
*H01L 21/8234* (2006.01)
*H01L 29/66* (2006.01)

(52) U.S. Cl.
CPC .............................. *H01L 29/66545* (2013.01)
USPC .... 438/230; 438/183; 438/303; 257/E21.444; 257/E21.453

(58) Field of Classification Search
CPC ................................................ H01L 29/66545
USPC .......................... 438/230, 183; 257/E21.453
See application file for complete search history.

(56) References Cited

U.S. PATENT DOCUMENTS

| 6,177,303 | B1 * | 1/2001 | Schmitz et al. ............... 438/194 |
| 6,369,423 | B2 | 4/2002 | Ohiwa et al. |
| 6,501,141 | B1 | 12/2002 | Leu |
| 6,696,333 | B1 * | 2/2004 | Zheng et al. .................. 438/230 |
| 6,967,408 | B1 | 11/2005 | Ko |
| 7,405,441 | B2 | 7/2008 | Deppe et al. |
| 7,723,173 | B2 | 5/2010 | Varghese et al. |
| 8,053,348 | B2 | 11/2011 | Anderson et al. |
| 2012/0086048 | A1 * | 4/2012 | Park et al. ..................... 257/192 |

FOREIGN PATENT DOCUMENTS

| KR | 1020070001738 A | 1/2007 |
| TW | 201025510 A | 7/2010 |

* cited by examiner

*Primary Examiner* — Allen Parker
(74) *Attorney, Agent, or Firm* — Joseph P. Abate; Howard M. Cohn (57) ABSTRACT

Methods of fabricating replacement metal gate transistors using bi-layer a hardmask are disclosed. By utilizing a bi-layer hardmask comprised of a first layer of nitride, followed by a second layer of oxide, the topography issues caused by transition regions of gates are mitigated, which simplifies downstream processing steps and improves yield.

20 Claims, 11 Drawing Sheets

REPLACEMENT METAL GATE TRANSISTORS USING BI-LAYER HARDMASK

FIELD OF THE INVENTION

The present invention relates generally to semiconductor fabrication, and more particularly, to methods of fabrication for replacement metal gate transistors.

BACKGROUND OF THE INVENTION

The fabrication of integrated circuits (ICs) involves the formation of features on a substrate that make up circuit components, such as transistors, resistors, and capacitors. The devices are interconnected, enabling the IC to perform the desired functions. A transistor includes a gate and source/drain diffusion regions adjacent thereto. The gate includes a gate electrode over a gate dielectric. Conventional transistors use polysilicon as the gate electrode and silicon oxide as the gate dielectric. An IC typically comprises both p-type and n-type transistors, forming complementary metal oxide semiconductor (CMOS) ICs. To meet increasing performance needs, transistors with metal gates are becoming more prevalent. Metal gate transistors are fabricated using a replacement metal gate (RMG) process, sometimes referred to as a "gate last" process. It is therefore desirable to have improvements for fabrication of replacement metal gate transistors.

SUMMARY OF THE INVENTION

In one embodiment of the present invention, a method of fabricating a replacement metal gate transistor is disclosed. The method comprises depositing a dummy gate, wherein the dummy gate comprises an N-type region, a P-type region, and a transition region, depositing a bi-layer over the dummy gate, wherein the bi-layer comprises a first sub-layer comprised of nitride, and a second sub-layer comprised of a first oxide layer, depositing a conformal nitride layer over the dummy gate, forming a first set of spacers adjacent to the dummy gate in the N-type region, forming a second set of spacers adjacent to the dummy gate in the P-type region, depositing a second oxide layer, planarizing the second oxide layer to the level of the top of the conformal nitride layer, and recessing the second oxide layer to the level of the first sub-layer of nitride. In another embodiment of the present invention, a method of fabricating a replacement metal gate transistor is disclosed. The method comprises depositing a dummy gate, wherein the dummy gate comprises an N-type region, a P-type region, and a transition region, depositing a bi-layer over the dummy gate, wherein the bi-layer comprises a first sub-layer comprised of nitride, and a second sub-layer comprised of a first oxide layer, depositing a conformal nitride layer over the dummy gate, masking the P-type region and transition region, forming a first set of spacers adjacent to the dummy gate in the N-type region, masking the N-type region and transition region, forming a second set of spacers adjacent to the dummy gate in the P-type region, depositing a second oxide layer, performing a chemical mechanical polish to planarize the second oxide layer to the level of the top of the conformal nitride layer, and recessing the second oxide layer to the level of the first sub-layer of nitride.

In another embodiment of the present invention, a method of fabricating a replacement metal gate transistor is disclosed. The method comprises depositing a dummy gate, wherein the dummy gate comprises an N-type region, a P-type region, and a transition region, depositing a bi-layer over the dummy gate, wherein the bi-layer comprises a first sub-layer comprised of nitride, and a second sub-layer comprised of a first oxide layer, depositing a conformal nitride layer over the dummy gate, forming a first set of spacers adjacent to the dummy gate in the P-type region, forming a second set of spacers adjacent to the dummy gate in the N-type region, depositing a second oxide layer, planarizing the second oxide layer to the level of the top of the conformal nitride layer, and recessing the second oxide layer to the level of the first sub-layer of nitride with an etch process that has an oxide etch rate and a nitride etch rate, and wherein the oxide etch rate is between 8 percent to 12 percent faster than the nitride etch rate.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

DETAILED DESCRIPTION

Figure 1:
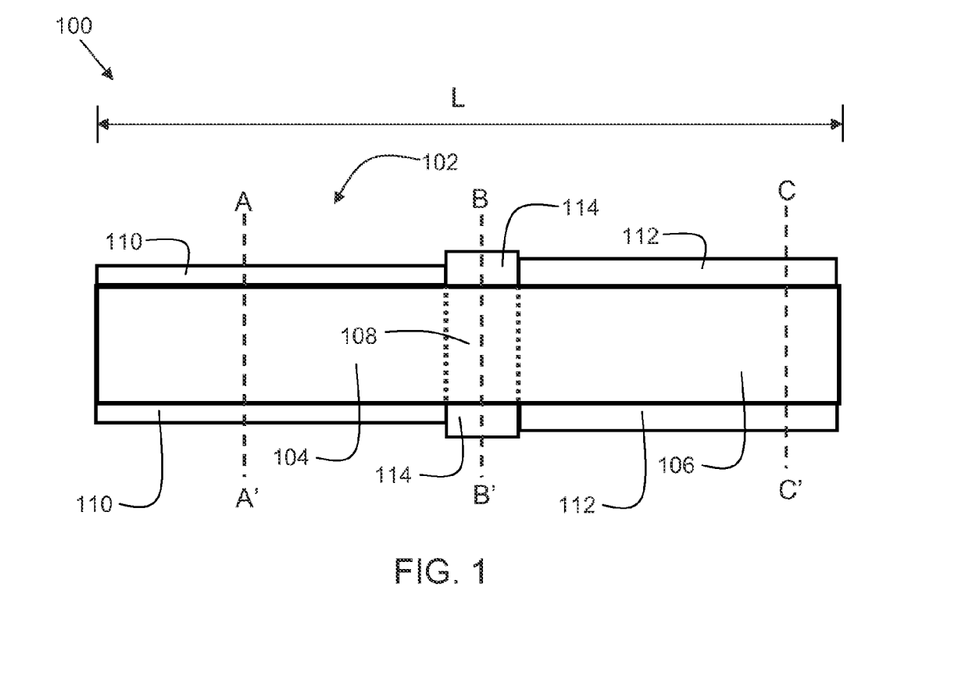
FIG. 1 shows a top down view of a gate having multiple regions.

FIG. 1 shows a top down view of a semiconductor structure 100 of a gate 102 having multiple regions. In some embodiments, the gate 102 has a length L ranging from about 0.02 micrometers to about 1.2 micrometers. Along gate 102, there may be multiple regions. The regions may include N-type regions and P-type regions. Transition regions are in between the N-type regions and P-type regions. Referring again to FIG. 1, line A-A' traverses an N-type region 104 of gate 102. Line B-B' traverses a transition region 108 of gate 102. Line C-C' traverses a P-type region 106 of gate 102. Nitride spacers are adjacent to the gate 102. P-type and N-type transistors typically require different spacer dimensions and/or locations. Spacers 110 are for the N-type region 104. Spacers 112 are for P-type region 106. Spacers 114 are located in transition region 108. The N-type region 104 is used to form an N-type transistor, such as an NFET (N-type field effect transistor), or N-type BJT (Bipolar Junction Transistor). Similarly, the P-type region 108 is used to form a P-type transistor. The transition region 108 is not used for a functional device. It separates the N-type region 104 from the P-type region 106, and enables separate, partially overlapping mask steps during the fabrication of the spacers. As a result of the overlapping mask region, the transition region 108 receives less etching or recessing than the N-type region 104 or P-type region 106. This can cause an uneven topography, which can complicate downstream processing steps and adversely affect yield. Embodiments of the present invention reduce the uneven topography, to simplify downstream processing and improve yield.

Figure 2:
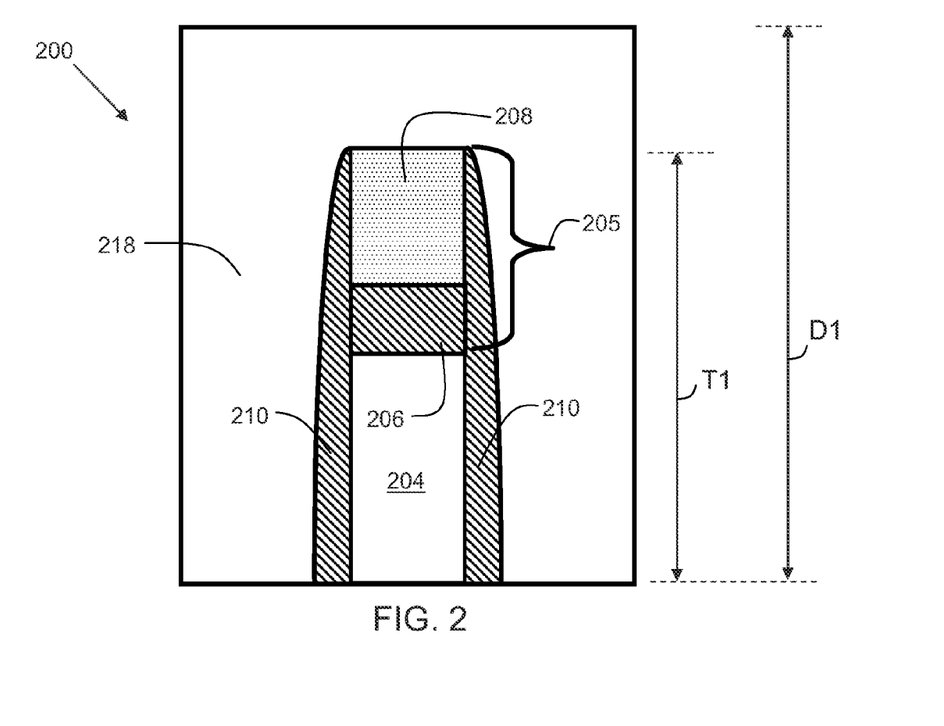
FIG. 2 is a cross section view of a gate along line A-A' of FIG. 1.

FIG. 2 is a cross section view of a semiconductor structure 200 as shown along line A-A' of FIG. 1. As stated previously, similar elements may be referred to by similar numbers in various figures (FIGs) of the drawing, in which case typically the last two significant digits may be the same. For example, spacer 210 of FIG. 2 is similar to spacer 110 of FIG. 1. Semiconductor structure 200 comprises a gate 204. Gate 204 is a dummy gate, and may be comprised of polysilicon. In subsequent downstream processing, the dummy gate 204 is replaced with a metal gate. A bi-layer gate cap 205 is comprised of a first sub-layer 206 which is disposed on, and in direct contact with, gate 204, and second sub-layer 208, which is disposed on, and in direct contact with, first sub-layer 206. In embodiments, the first sub-layer 206 is comprised of nitride. The nitride may be silicon nitride. In embodiments, the second sub-layer 208 is comprised of oxide. The oxide may be silicon oxide. Nitride spacers 210 are adjacent to, and in direct contact with gate 204. A dielectric layer 218 (not shown in FIG. 1) is deposited over the gate, gate cap, and spacers. The dielectric layer has a height D1 which is greater than the height T1 of the spacers 210.

Figure 3:
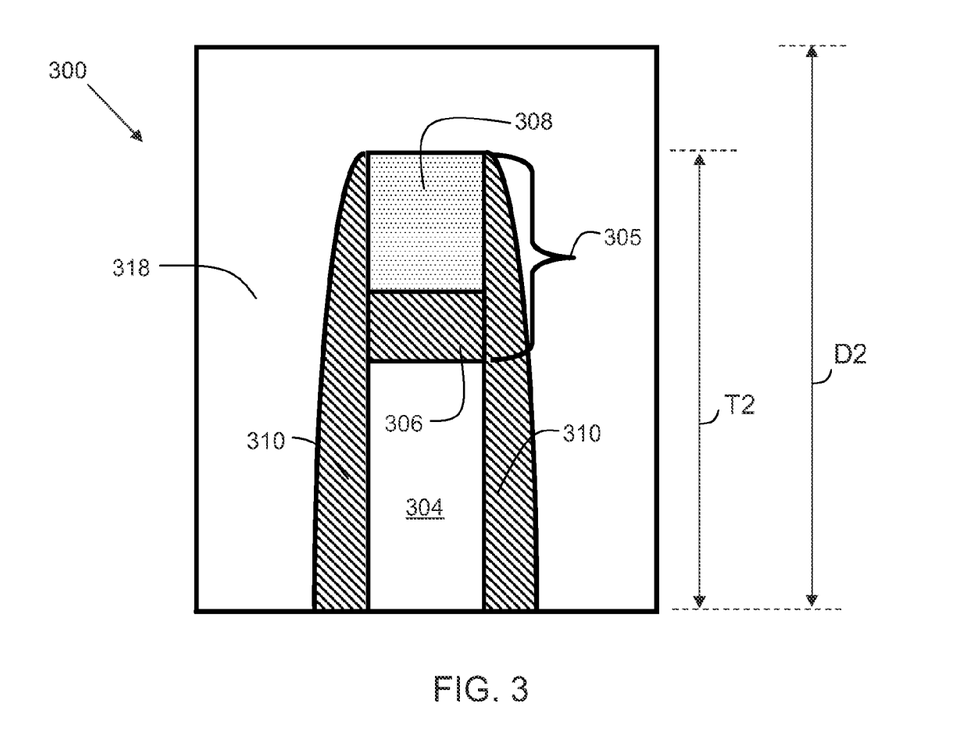
FIG. 3 is a cross section view of a gate along line C-C' of FIG. 1.

FIG. 3 is a cross section view of a semiconductor structure 200 as shown along line C-C' of FIG. 1. Semiconductor structure 300 comprises a gate 304. Gate 304 is a dummy gate, and may be comprised of polysilicon. In subsequent downstream processing, the dummy gate 304 is replaced with a metal gate. Nitride spacers 310 are adjacent to, and in direct contact with gate 304. Nitride spacers 310 are generally of similar material to that of nitride spacers 210 of FIG. 2, but may be of different dimensions and/or locations with respect to the gate than spacers 210. A dielectric layer 318 (not shown in FIG. 1) is deposited over the gate, gate cap, and spacers. The dielectric layer has a height D2 which is greater than the height T2 of the spacers 310. Height D2 may be approximately equal to height D1 (FIG. 2). T2 may be unequal to height T1 (FIG. 2).

Figure 4:
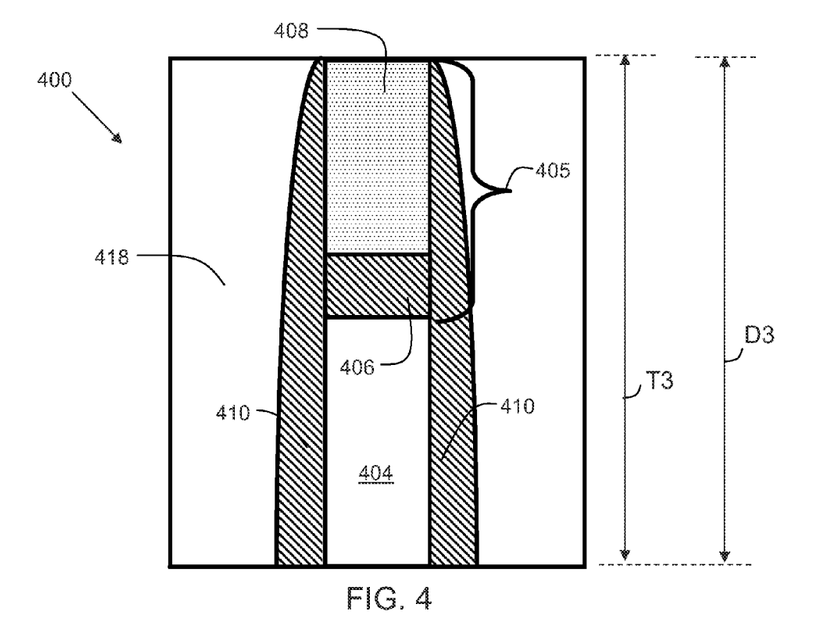
FIG. 4 is a cross section view of a gate along line B-B' of FIG. 1.

FIG. 4 is a cross section view of a semiconductor structure 400 as shown along B-B' of FIG. 1. Semiconductor structure 400 comprises a gate 404. Gate 404 is a dummy gate, and may be comprised of polysilicon. Nitride spacers 410 are adjacent to, and in direct contact with gate 404. Nitride spacers 410 are generally of similar material to that of nitride spacers 210 of FIG. 2 and nitride spacers 310 of FIG. 3. However, because structure 400 is in a transition region, the spacers 410 are taller than spacers 310 (FIG. 3) and spacers 210 (FIG. 2), as the transition region does not undergo the same etch/recess processing as the N-type and P-type regions. A dielectric layer 418 (not shown in FIG. 1) is deposited over the gate, gate cap, and spacers. The dielectric layer has a height D3 which approximately equal to height T3 of the spacers 410. Height D3 may be approximately equal to height D2 (FIG. 3) and height D1 (FIG. 2). T3 may be larger than height T2 (FIG. 3) and height T1 (FIG. 2).

Referring to FIGS. 2-4, the variation amongst T1, T2, and T3 reflect the difference in spacer height. The first sub-layer (206, 306, 406) of the gate caps may be of equal thickness, whereas the second sub-layer (208, 308, and 308) of the gate cap may have varying thickness, such that the top of the gate cap is horizontally coplanar with the spacers. This novel feature serves to mitigate topology issues, as will be described in forthcoming paragraphs.

FIGS. 5-15 illustrate various steps in the fabrication process. For illustrative clarity, some processing steps may be combined in some of the drawings.

Figure 5:
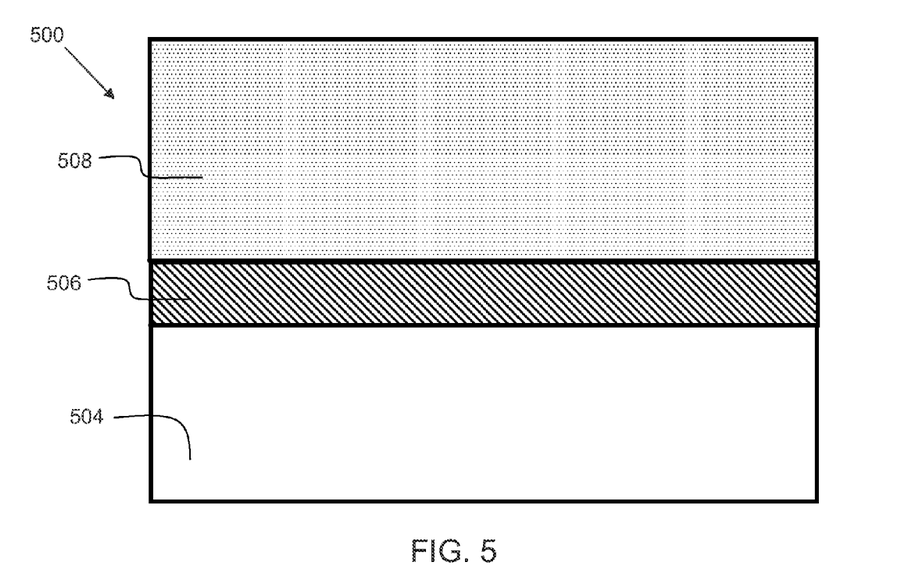
FIG. 5 shows a semiconductor structure at a starting point for methods in accordance with embodiments of the present invention.

FIG. 5 shows a semiconductor structure 500 at a starting point for methods in accordance with embodiments of the present invention. Semiconductor structure 500 comprises a semiconductor substrate 504, which may be a silicon substrate, and may comprise a wafer or die, or region thereof. A nitride layer 506 is blanket deposited over substrate 504. Nitride layer 506 forms the first sub-layer of the gate caps. The nitride layer 506 may be deposited via chemical vapor deposition (CVD), or other suitable technique. In some embodiments, the thickness of nitride layer 506 is in the range of about 10 nanometers to about 40 nanometers. In other embodiments, the thickness of nitride layer 506 is in the range of about 20 nanometers to about 50 nanometers. An oxide layer 508 is blanket deposited over nitride layer 506. Oxide layer 508 forms the second sub-layer of the gate caps. The oxide layer 508 may be deposited via chemical vapor deposition (CVD), or other suitable technique. In some embodiments, the thickness of oxide layer 508 is in the range of about 50 nanometers to about 100 nanometers. In other embodiments, the thickness of oxide layer 508 is in the range of about 60 nanometers to about 150 nanometers.

Figure 6:
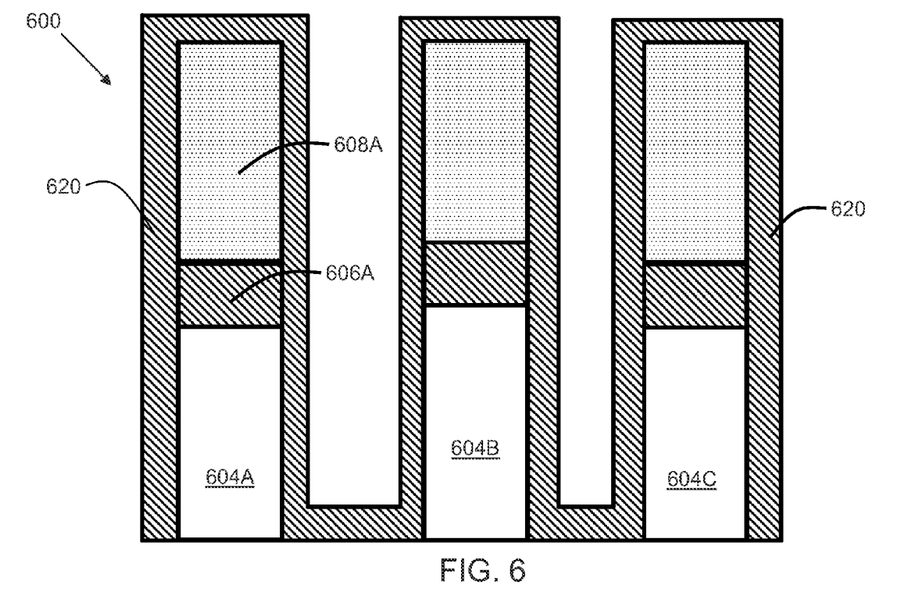
FIG. 6 shows a semiconductor structure after subsequent process steps of patterning and depositing a conformal nitride layer.

FIG. 6 shows a semiconductor structure 600 after subsequent process steps of patterning and depositing a conformal nitride layer. The patterning may be performed using industry-standard lithography and patterning techniques. The result of the patterning is multiple gates, indicated as 604A, 604B, and 604C. Gate 604 has first sub-layer 606A and second sub-layer 608A disposed thereon. After the patterning process, a conformal nitride layer 620 is deposited over the structure. The nitride layer 620 is in direct physical contact with the sides of the gates 604A, 604B, and 604C. Nitride layer 620 may be deposited by chemical vapor deposition (CVD), or other suitable method. In some embodiments, the nitride layer 620 has a thickness ranging from about 20 nanometers to about 50 nanometers.

Figure 7:
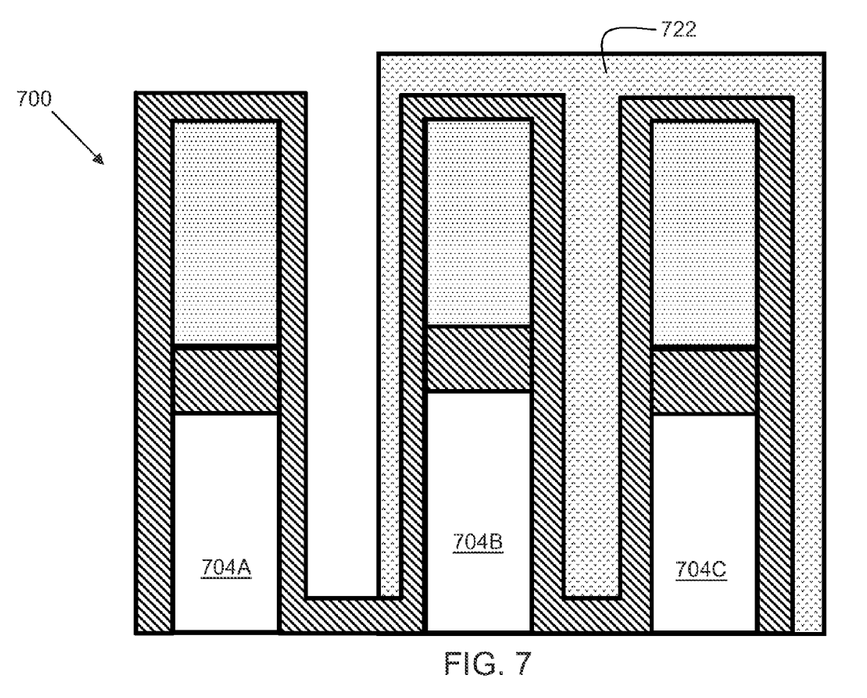
FIG. 7 shows a semiconductor structure after subsequent process steps of applying a mask to P-type and transition areas.

FIG. 7 shows a semiconductor structure 700 after subsequent process steps of applying a mask 722 over gates 704B and 704C. The mask 722 may be comprised of photoresist, and may be applied using industry-standard deposition and lithographic methods.

Figure 8:
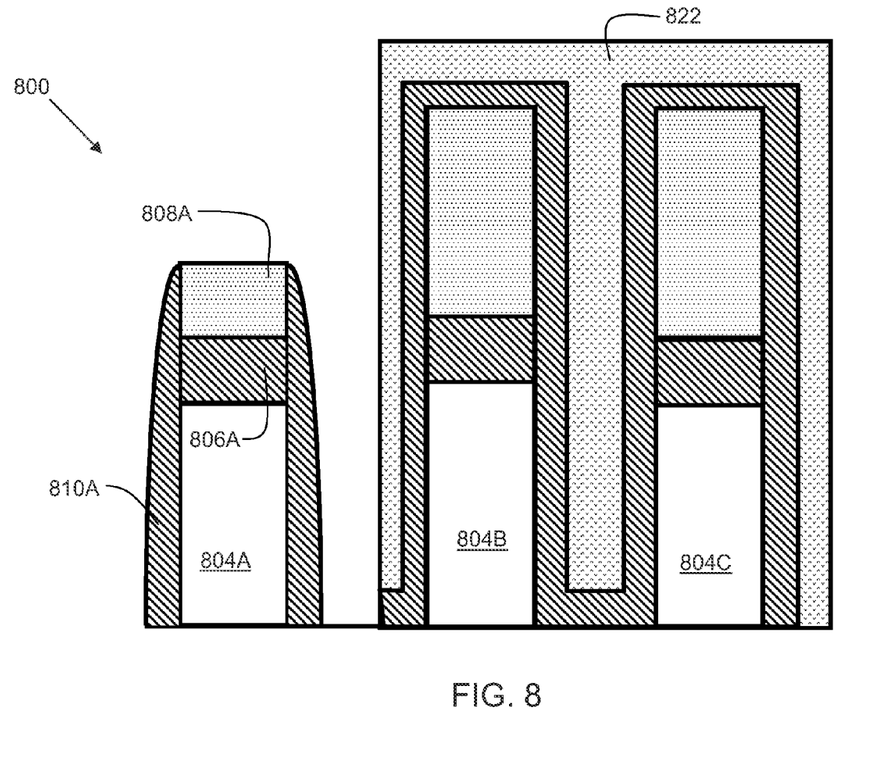
FIG. 8 shows a semiconductor structure after subsequent process steps of forming N-type transistor spacers.

FIG. 8 shows a semiconductor structure after subsequent process forming N-type transistor spacers 810A. An anisotropic etch process is used to form spacers 810A from the conformal nitride layer (620 of FIG. 6). In some embodiments, a reactive ion etch is used as the anisotropic etch. During the etch process, the second sub-layer 808A of the gate cap may also be partially recessed. Gate 804A is for an N-type transistor, such as an NFET.

Figure 9:
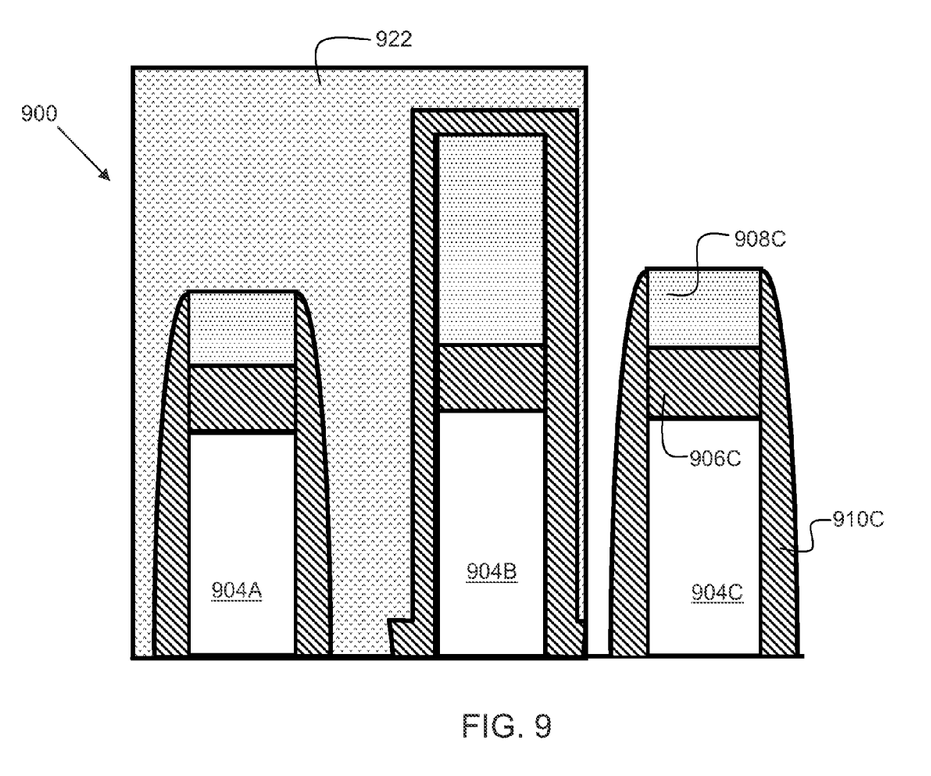
FIG. 9 shows a semiconductor structure after subsequent process steps of masking the transition and N-type areas, and forming P-type transistor spacers.

FIG. 9 shows a semiconductor structure 900 after subsequent process steps of masking the transition and N-type areas with mask region 922, and forming P-type transistor spacers 910C via a similar anisotropic etch process as used for forming spacers 810A of FIG. 8. However, the etch parameters (such as etch times and rates) may differ from the etch used to form spacers 810A, such that spacers 910C may be of a different size than spacers 810A. This is because P-type transistors often have different optimal spacer sizes than complementary N-type transistors. During the etch process, the second sub-layer 908C of the gate cap may also be partially recessed. Gate 904C is for a P-type transistor, such as a PFET.

Figure 10:
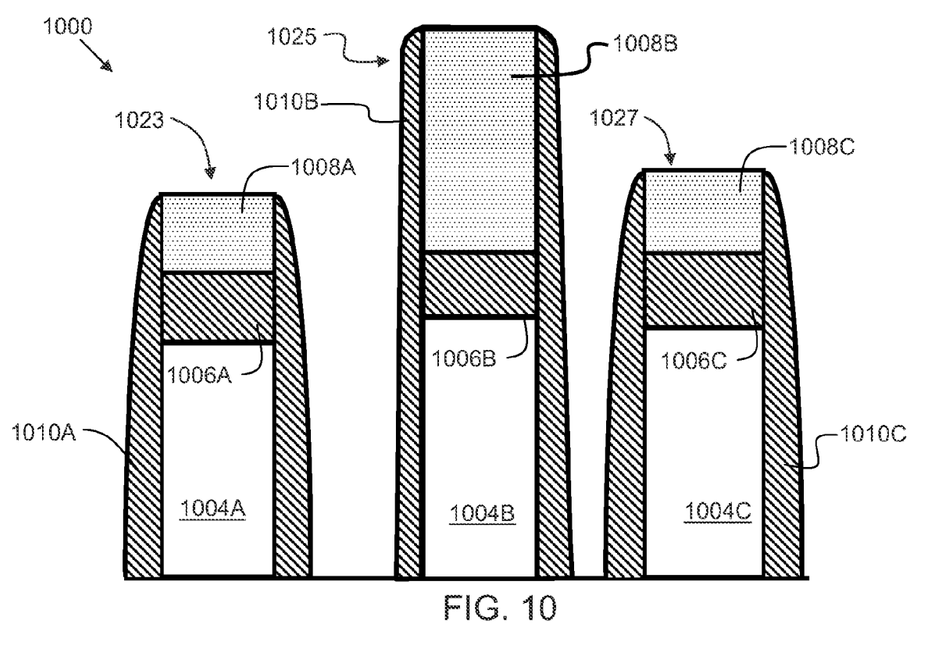
FIG. 10 shows a semiconductor structure after subsequent process steps of removing the masks and performing a nitride etch.

FIG. 10 shows a semiconductor structure 1000 after subsequent process steps of removing the masks (compare with 922 of FIG. 9) and performing a nitride etch to expose the second sub-layer 1008B of gate 1004B, which represents a transition region. Structure 1000 shows three different gate stacks (1023, 1025, and 1027), each with different spacer heights. As can be seen, the spacers 1010B of gate stack 1025, which is in the transition region, are taller than spacers 1010A of an N-type transistor region of gate stack 1023 and are also taller than spacers 1010C of a P-type transistor region of gate stack 1027.

Figure 11:
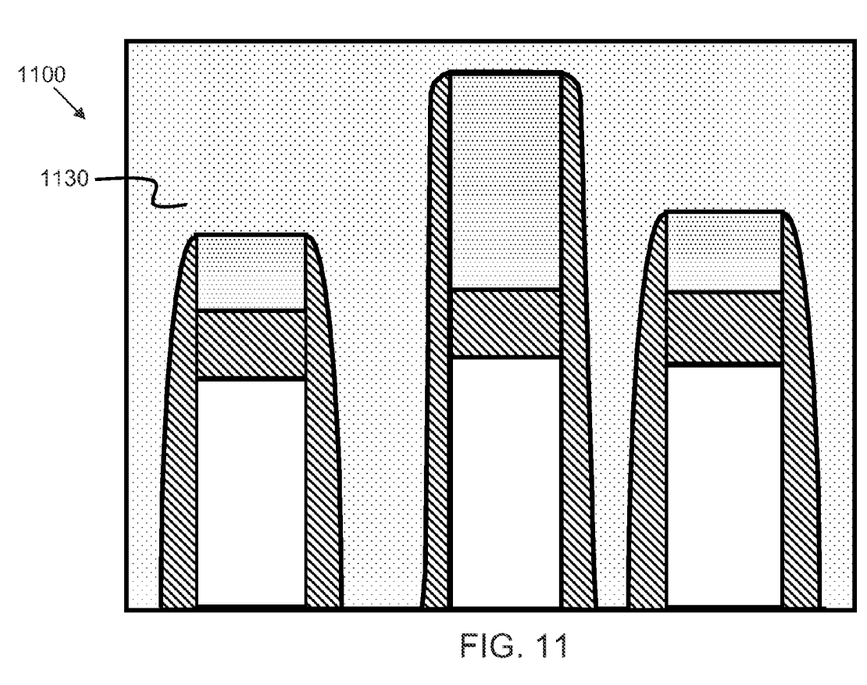
FIG. 11 shows a semiconductor structure after a subsequent process step of depositing a second oxide layer.

FIG. 11 shows a semiconductor structure 1100 after a subsequent process step of depositing a second oxide layer 1130. The second oxide layer 1130 may be deposited via chemical vapor deposition, or other suitable technique. The second oxide layer 1130 may be comprised of a similar material to that of the second sub-layer (e.g. 508 of FIG. 5).

Figure 12:
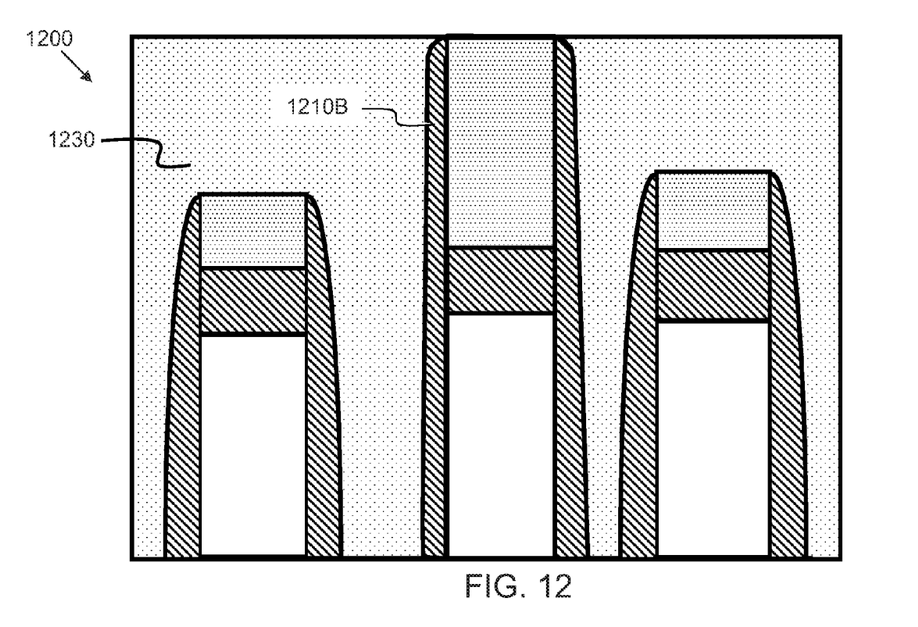
FIG. 12 shows a semiconductor structure after a subsequent process step of planarizing the structure to the level of the highest nitride.

FIG. 12 shows a semiconductor structure 1200 after a subsequent process step of planarizing the second oxide layer 1230 to the level of the transition region spacers 1210B, which is the highest nitride of structure 1200. The planarization may be performed via a chemical mechanical polish.

Figure 13:
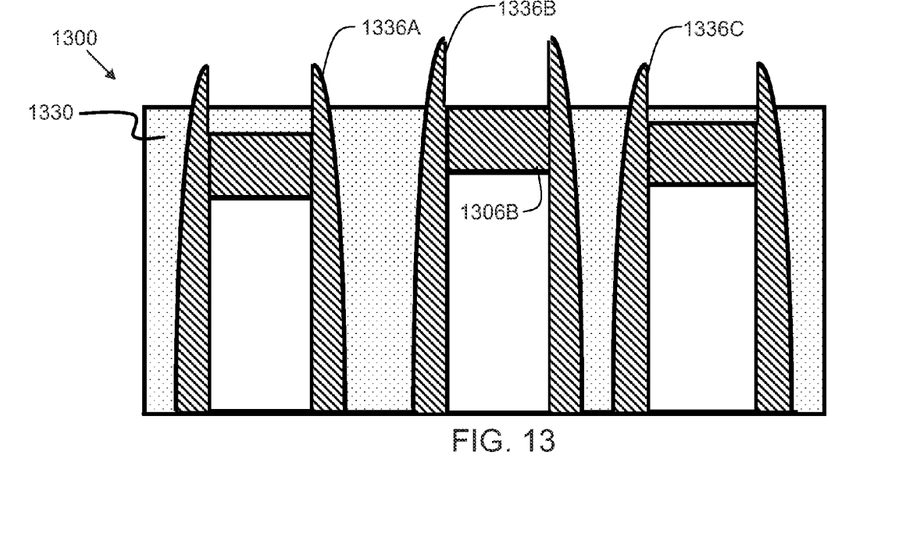
FIG. 13 shows a semiconductor structure after a subsequent process step of recessing the oxide.

FIG. 13 shows a semiconductor structure 1300 after a subsequent process step of recessing the second oxide layer 1330 to the level of the first sub-layer. In some embodiments, the recess may be performed with an etch process that etches oxide and nitride at approximately the same rate. In one embodiment, a non-selective reactive ion etch is used. In other embodiments, the recess may be performed with an etch process that etches oxide at a slightly faster rate than the rate at which it etches nitride. In some embodiments, the oxide etch rate is 8% to 12% faster than the nitride etch rate. In some embodiments, the oxide etch rate ranges from about 80 nanometers per minute to about 120 nanometers per minute. The etch process may be a fluorine-based etch process. In some embodiments, the etchant is made from hydrofluoric acid, ammonium fluoride, fluoroboric acid, aluminum hexafluoride, or combinations thereof. In embodiments where the oxide etch rate is faster than the nitride etch rate, small "horn regions" of the spacers protrude above second oxide layer 1330. These horn spacer regions are indicated by reference numbers 1336A, 1336B, and 1336C. The horn spacer regions may serve to prevent divots in the structure on subsequent process steps.

Figure 14:
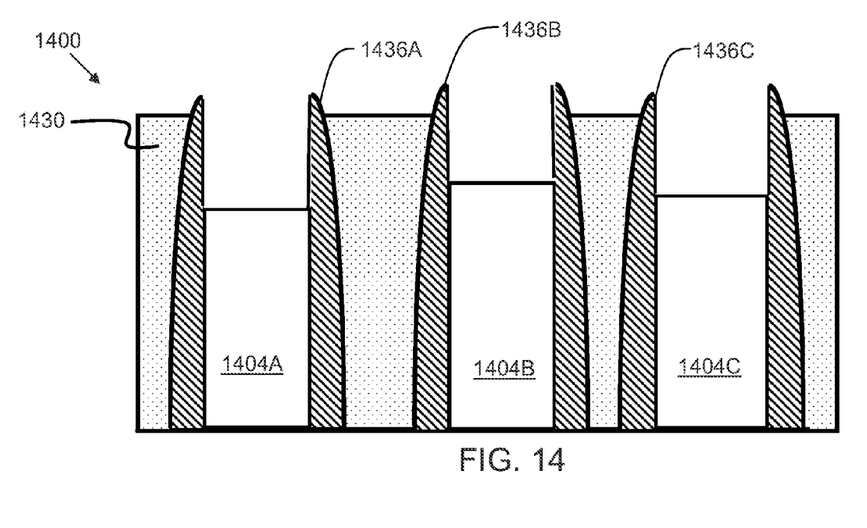
FIG. 14 shows a semiconductor structure after a subsequent process step of exposing the dummy gates.

FIG. 14 shows a semiconductor structure 1400 after a subsequent process step of performing a "gate open" to expose the dummy gates 1404A, 1404B, and 1404C. The gate open process may be performed via a selective nitride etch which removes the first sub-layer (see 1006A, 1006B, and 1006C of FIG. 10). The nitride etch may also slightly reduce the height of the spacers 1436A, 1463B, and 1436C. However, as the first sub-layer is thin, the etch process terminates before the spacers are significantly impacted.

Figure 15:
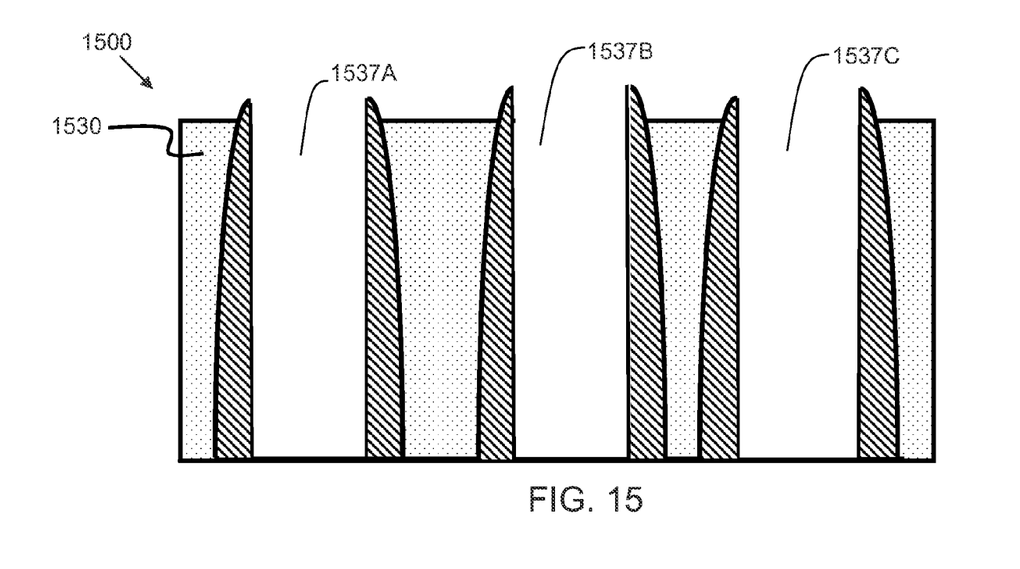
FIG. 15 shows a semiconductor structure after a subsequent process step of removing the dummy gates.

FIG. 15 shows a semiconductor structure 1500 after a subsequent process step of removing the dummy gates to form gate cavities 1537A, 1537B, and 1537C. The dummy gates are removed via an etch process selective for removal of polysilicon. The polysilicon etch may use reactive ion etching or a wet etch in a solution of tetramethylammonium hydroxide (TMAH) in one embodiment. In another embodiment tetraethylammonium hydroxide or another tetra(alkyl)ammonium hydroxide may be used.

Figure 16:
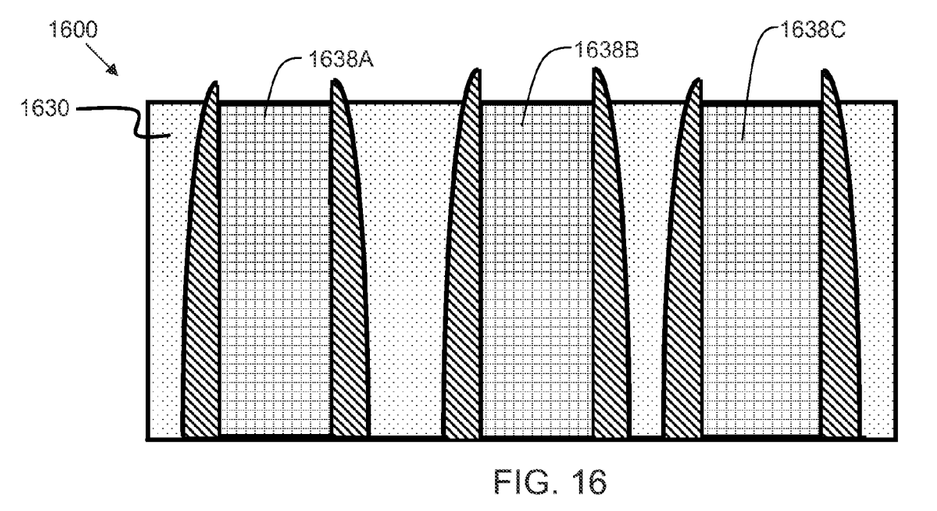
FIG. 16 shows a semiconductor structure after a subsequent process step of depositing replacement metal gates.

FIG. 16 shows a semiconductor structure 1600 after a subsequent process step of depositing replacement metal gates. Metal gates 1638A, 1638B, and 1638C are deposited in the cavities formed by the removal of the dummy gates. Prior to depositing the gate electrodes, a high-k dielectric layer (not shown), such as a hafnium oxide layer may be deposited in the gate cavities. The material used for the metal gates may vary, and may depend on the type of transistor. For example, in the case of field effect transistors, gate 1638A, used for an NFET, may comprise hafnium, zirconium, titanium, tantalum, aluminum, and their alloys, e.g., metal carbides that include these elements, i.e., hafnium carbide, zirconium carbide, titanium carbide, tantalum carbide, and aluminum carbide, and gate 1638C, used for a PFET, may comprise ruthenium, palladium, platinum, cobalt, nickel, and conductive metal oxides, e.g., ruthenium oxide. The transition region is not used for a functional device, and hence, may be filled with half of each type of metal, or in some embodiments, the dummy gate may remain in the transition region. In some embodiments, the metal used for gate 1638A and gate 1638C may be selected from the following: gold, silver, copper, platinum, rhenium, ruthenium, rhodium, nickel, osmium, palladium, iridium, cobalt, or alloys thereof. From this point forward, industry-standard processes may be used to complete the transistors, and additional metallization and wiring steps for making a functional integrated circuit (IC).

Figure 17:
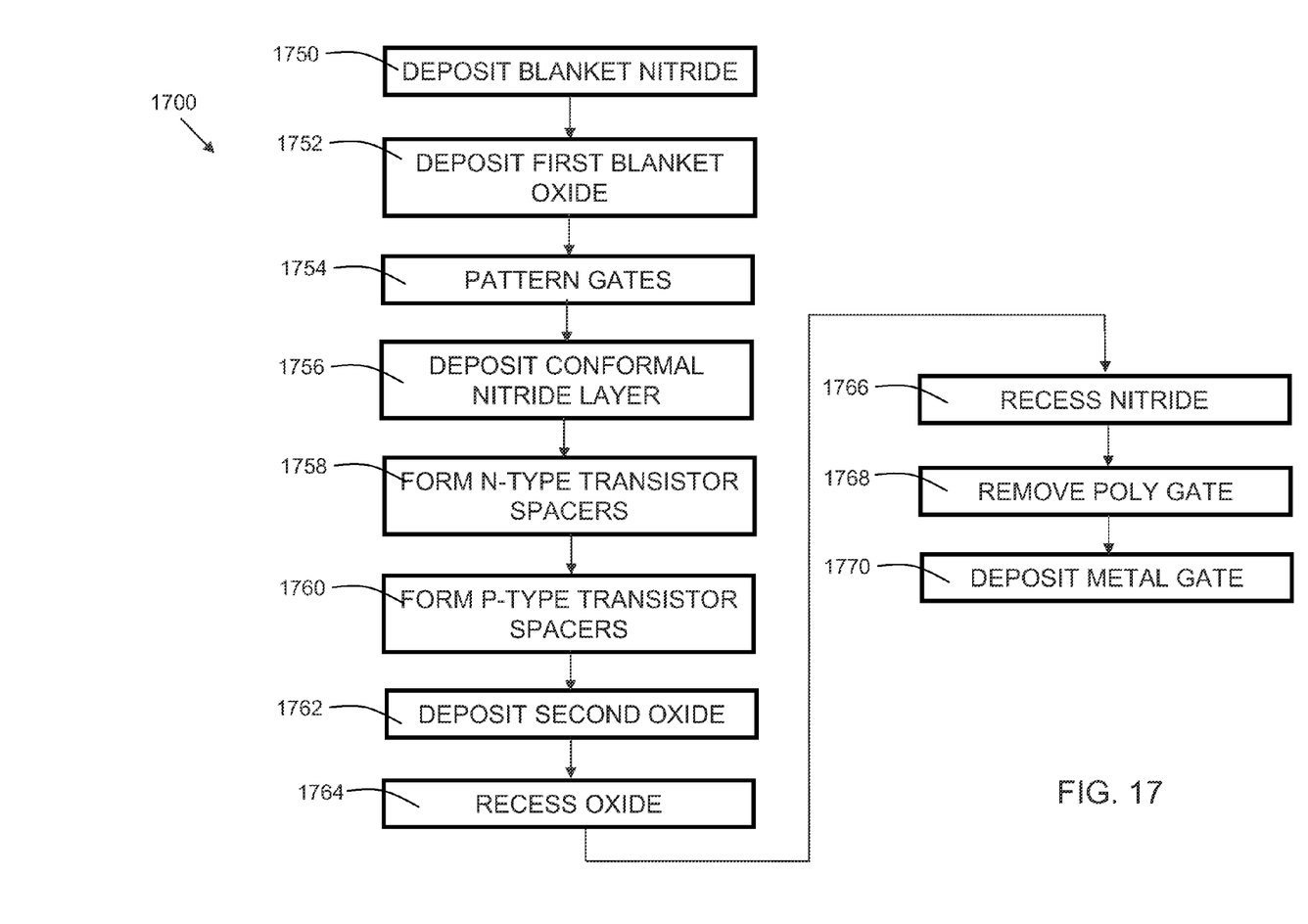
FIG. 17 is a flowchart indicating process steps for embodiments of the present invention.

FIG. 17 is a flowchart 1700 indicating process steps for embodiments of the present invention. In process step 1750, a nitride layer is deposited via a blanket deposition process (see 506 of FIG. 5). In process step 1752, an oxide layer is deposited via a blanket deposition process (see 508 of FIG. 5). In process step 1754, gate regions are formed by patterning (see 604A, 604B, and 604C of FIG. 6). In process step 1756, a conformal nitride layer is deposited (see 620 of FIG. 6). In process step 1758, N-type transistor spacers are formed (see 810A of FIG. 8). In process step 1760, P-type transistor spacers are formed (see 910C of FIG. 9). In process step 1762, a second oxide layer is deposited (see 1130 of FIG. 11). In process step 1764 the second oxide layer is recessed to the level of the first sub-layer of the gate cap (see 1330 and 1306B of FIG. 13). In process step 1766, the nitride of the first sub-layer is recessed and removed (see 1400 of FIG. 14). In process step 1768 the dummy polysilicon gates are removed, forming gate cavities (see 1537A, 1537B, and 1537C of FIG. 15). In process step 1770, replacement metal gates are formed (see 1638A, 1638B, and 1638C of FIG. 16).

Note that while flowchart 1700 shows the step 1758 of forming N-type transistor spacers prior to forming P-type transistor spacers in step 1760, embodiments of the present invention may swap these steps, and form the P-type transistor spacers prior to forming the N-type transistor spacers.

Embodiments of the present invention provide for an improved method of fabricating complementary replacement metal gate transistors. By utilizing a bi-layer hardmask comprised of a first layer of nitride, followed by a second layer of oxide, the topography issues caused by transition regions of gates are mitigated, which simplifies downstream processing steps and improves yield.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a replacement metal gate transistor, comprising:
 depositing a dummy gate,
  wherein the dummy gate comprises
   an N-type region,
   a P-type region, and
   a transition region;
 depositing a bi-layer
  over the dummy gate,
  wherein the bi-layer comprises
   a first sub-layer comprised of nitride, and
   a second sub-layer comprised of a first oxide layer;
 depositing a conformal nitride layer over the dummy gate;
 forming a first set of spacers
  adjacent to the dummy gate
  in the N-type region;
 forming a second set of spacers
  adjacent to the dummy gate
  in the P-type region;
 depositing a second oxide layer to cover the bi-layer, the first set of spacers, and the second set of spacers;
 planarizing the second oxide layer to leave a remaining portion with a height at the level of the top of the conformal nitride layer; and
 recessing the second oxide layer to the level of the first sub-layer of nitride.

2. The method of claim 1, further comprising removing the first sub-layer after recessing the second oxide layer to the level of the first sub-layer of nitride.

3. The method of claim 2, further comprising removing the dummy gate after removing the first sub-layer, thereby forming a gate cavity.

4. The method of claim 3, further comprising filling the gate cavity with one or more replacement materials.

5. The method of claim 4, wherein filling the gate cavity with one or more replacement materials comprises filling the gate cavity with a material selected from the group consisting of: gold, silver, copper, platinum, rhenium, ruthenium, rhodium, nickel, osmium, palladium, iridium, and cobalt.

6. The method of claim 1, further comprising masking the P-type region and transition region prior to forming the first set of spacers adjacent to the dummy gate in the N-type region.

7. The method of claim 6, further comprising masking the N-type region and transition region prior to forming the first set of spacers adjacent to the dummy gate in the P-type region.

8. A method of fabricating a replacement metal gate transistor, comprising:
 depositing a dummy gate,
  wherein the dummy gate comprises
   an N-type region,
   a P-type region, and
   a transition region;
 depositing a bi-layer
  over the dummy gate,
  wherein the bi-layer comprises
   a first sub-layer comprised of nitride, and
   a second sub-layer comprised of a first oxide layer;
 depositing a conformal nitride layer over the dummy gate;
 masking the P-type region and transition region;
 forming a first set of spacers
  adjacent to the dummy gate
  in the N-type region;
 masking the N-type region and transition region;
 forming a second set of spacers
  adjacent to the dummy gate
  in the P-type region;
 depositing a second oxide layer to cover the bi-layer, the first set of spacers, and the second set of spacers;
 performing a chemical mechanical polish
  to planarize the second oxide layer
  to the level of the top of the conformal nitride layer; and
 recessing the second oxide layer to leave a remaining portion with a height at the level of the first sub-layer of nitride.

9. The method of claim 8, wherein depositing a conformal nitride layer is performed via a chemical vapor deposition process.

10. The method of claim 8, wherein masking the N-type region and transition region comprises depositing photoresist.

11. The method of claim 8, wherein recessing the second oxide layer to the level of the first sub-layer of nitride comprises performing an etch with an oxide etch rate ranging from about 80 nanometers per minute to about 120 nanometers per minute.

12. The method of claim 8, wherein recessing the second oxide layer to the level of the first sub-layer of nitride comprises performing a fluorine based etch.

13. The method of claim 8, wherein forming a first set of spacers adjacent to the dummy gate in the N-type region is performed via an anisotropic etch.

14. The method of claim 13, wherein the anisotropic etch is a reactive ion etch.

15. A method of fabricating a replacement metal gate transistor, comprising:
 depositing a dummy gate,
  wherein the dummy gate comprises
   an N-type region, a P-type region, and
a transition region;
depositing a bi-layer
over the dummy gate,
wherein the bi-layer comprises
a first sub-layer comprised of nitride, and
a second sub-layer comprised of a first oxide layer;
depositing a conformal nitride layer over the dummy gate;
forming a first set of spacers
adjacent to the dummy gate
in the N-type region;
forming a second set of spacers
adjacent to the dummy gate
in the P-type region;
depositing a second oxide layer to cover the bi-layer, the first set of spacers, and the second set of spacers;
planarizing the second oxide layer to the level of the top of the conformal nitride layer; and
recessing
the second oxide layer to leave a remaining portion with a height at the level of the first sub-layer of nitride
with an etch process that has
an oxide etch rate and
a nitride etch rate, and
wherein the oxide etch rate is between 8 percent to 12 percent faster than the nitride etch rate.

16. The method of claim 15, wherein depositing a bi-layer over the dummy gate comprises depositing the first sub-layer with a thickness ranging from about 10 nanometers to about 40 nanometers.

17. The method of claim 15, wherein depositing a bi-layer over the dummy gate comprises depositing the second sub-layer with a thickness ranging from about 50 nanometers to about 100 nanometers.

18. The method of claim 15, wherein depositing a conformal nitride layer over the dummy gate comprises depositing a nitride layer with a thickness ranging from about 20 nanometers to about 50 nanometers.

19. The method of claim 15, wherein recessing the second oxide layer to the level of the first sub-layer of nitride comprises:
performing a non-selective reactive ion etch; and
leaving a spacer region protruding above the second oxide layer.

20. The method of claim 15, further comprising:
removing the first sub-layer after recessing the second oxide layer to the level of the first sub-layer of nitride;
removing the dummy gate after removing the first sub-layer, thereby forming a gate cavity; and
filling the gate cavity with one or more replacement materials.

* * * * *